United States Patent

Meller et al.

[11] Patent Number: 5,818,265
[45] Date of Patent: Oct. 6, 1998

[54] DIGITAL PHASE DETECTOR

[75] Inventors: Wolfgang Meller, Backnang; Fritz Widmann, Ilsfeld, both of Germany

[73] Assignee: Robert Bosch GmbH, Stuttgart, Germany

[21] Appl. No.: 656,320

[22] PCT Filed: Nov. 23, 1994

[86] PCT No.: PCT/DE94/01380

§ 371 Date: Jun. 3, 1996

§ 102(e) Date: Jun. 3, 1996

[87] PCT Pub. No.: WO95/18384

PCT Pub. Date: Jul. 6, 1995

[30] Foreign Application Priority Data

Dec. 29, 1993 [DE] Germany ............................. 43 44 867.4

[51] Int. Cl.[6] .................................................. H03K 5/26
[52] U.S. Cl. ................................. 327/6; 327/10; 327/12; 327/150; 327/159
[58] Field of Search ........................... 327/2, 3, 5, 7, 327/9, 10, 12, 156, 150, 151, 159, 160

[56] References Cited

U.S. PATENT DOCUMENTS

| | | | |
|---|---|---|---|
| 3,641,447 | 2/1972 | Gaines et al. | 327/10 |
| 4,246,497 | 1/1981 | Lawson et al. | 327/12 |
| 4,264,866 | 4/1981 | Benes | 327/3 |
| 4,506,175 | 3/1985 | Reitmeier et al. | 327/12 |
| 5,180,933 | 1/1993 | Krzyzanowski | 327/7 |

OTHER PUBLICATIONS

Ein Digitales Phasenmassgerat. Nessler & Fritz, Elektronik 1974, Heft 9, pp. 319–324 no month.
Halbleiter–Schaltungegstechnik. Tietze & Schenk.
Theorie Und Anwendugen Des Phase–Locked Loops. Best no date.

*Primary Examiner*—Timothy P. Callahan
*Assistant Examiner*—T. T. Lam
*Attorney, Agent, or Firm*—Michael J. Striker

[57] ABSTRACT

The digital phase detector detects a phase shift between a comparison clock pulse signal (VT) and a reference clock pulse signal (RT). It includes logic gates (STO,STA) for generating start and stop pulses from respective successive pulses of the comparison and reference clock pulse signals (RT,VT). A counter (ZG,Z) counts the pulses of a counter clock pulse signal (ZT) of a higher frequency in a time window between the start signal and the subsequent stop signal. The counter value of the counter is a measure of the phase shift between the comparison and reference clock pulse signals (VT,RT). Quantization errors in the phase shift signal are considerably reduced by providing a logical gate (VZ) for determining the sign of the phase shift and a device ($\mu$P) for adding a constant, advantageously 0.5, to the counter value. The phase detector of the invention makes possible phase control loops providing precise pulse tracking, since it makes available a regulating signal, even with the smallest phase shifts between the comparison and reference clock pulse signals.

5 Claims, 5 Drawing Sheets

DIGITAL PHASE DETECTOR

BACKGROUND OF THE INVENTION

The instant invention relates to a digital phase detector and, more particularly, to a digital phase detector for determining a phase relationship between a reference clock pulse signal and a comparison clock pulse signal and also to a method for determining this phase relationship in a phase control circuit.

A phase measuring device is known from N. Nessler, D. Fritz, "Ein digitales PhasenmeBgerät" [A Physical Phase-Measuring Device], ELEKTRONIK 1974, Issue 9, Vol. 23, pp. 319 et seq., which discloses a digital phase detector of the type mentioned at the outset.

A digital phase detector with means which generate start and stop signals from chronologically successive pulses of a reference clock and a comparison clock, and with a counter, which counts the pulses from a counting clock in the time window between a start signal and the succeeding stop signal, wherein the counter value of the counter is a measure of the phase shift between the reference clock pulse and comparison clock pulse, is known. This digital phase detector is described in R. Best "Theorie und Anwendungen des Phase-locked Loops" [Theory and Applications of the Phase-Locked Loop], AT-Verlag [AT Publishers] Aarau, Stuttgart, 4th Edition, 1987, p. 46, Ill. 31/3. This phase detector has the disadvantage that very small phase differences are not detected because of quantization errors.

An analog phase detector, which delivers an output signal which has a sign, is disclosed in Tietze/Schenk "Halbleiter-Schaltungstechnik" [Semiconductor Circuit Technology], Springer Verlag [publishers] Berlin, Heidelberg, 10th Edition, 1993, pp. 962 et seq. This output signal is a rectangular pulse, whose width is proportional to the phase difference and its amplitude is negative when there is a negative phase difference.

SUMMARY OF THE INVENTION

It is an object of the present invention to provide a digital phase detector of the type mentioned at the outset, which is inexpensive and has a high phase resolution.

This object, and others which will become more important hereinafter, are attained in a digital phase detector comprising means for generating a start signal and means for generating a stop signal from respective chronologically successive pulses of a reference clock pulse signal and a comparison clock pulse signal, a counter for counting counter clock pulses of a counter clock pulse signal, advantageously having a higher frequency than that of the reference and comparison clock signals, means for turning the counter on in response to the start signal and for turning the counter off in response to the stop signal so that the counter counts the counter clock pulses during a time window between the start and stop signals to obtain a counter count which is a measure of a phase shift between the reference clock pulse signal and the comparison clock pulse signal.

According to the invention quantization errors in the phase shift are reduced by including means for obtaining phase shift sign information from the comparison clock pulse signal and the reference clock pulse signal, and means for adding a constant to the counter count and for subsequently assigning the phase shift sign information thereto to form a resulting phase shift signal.

In a preferred embodiment of the invention the means for adding the constant includes a digital input for the counter count and means for performing the adding including fixed wiring at the input that adds the constant to the counter value. Advantageously the constant is 0.5 and the means for adding the constant includes a digital input for the counter count, means for shifting k bits of the counter count at the digital input toward higher bit values and resetting a lowest bit of the k bits permanently to level "H" at the digital input.

The digital phase detector is advantageously used in a phase control circuit to considerably reduce quantization errors.

A digital phase detector which detects a phase difference between two pulses by counting the time difference existing between the two pulses by means of a counting pulse of higher frequency has quantizing errors. The accuracy of this phase detector often is not satisfactory, even with very high counting pulses. The effects of the quantizing error on the output phase of a phase control circuit are considerably reduced by means of the steps in accordance with the invention. It is possible to follow a reference clock pulse precisely with a comparison clock pulse.

BRIEF DESCRIPTION OF THE DRAWING

Exemplary embodiments of the invention will be explained by means of the drawings, in which.

DESCRIPTION OF THE PREFERRED EMBODIMENTS

Figure 1:
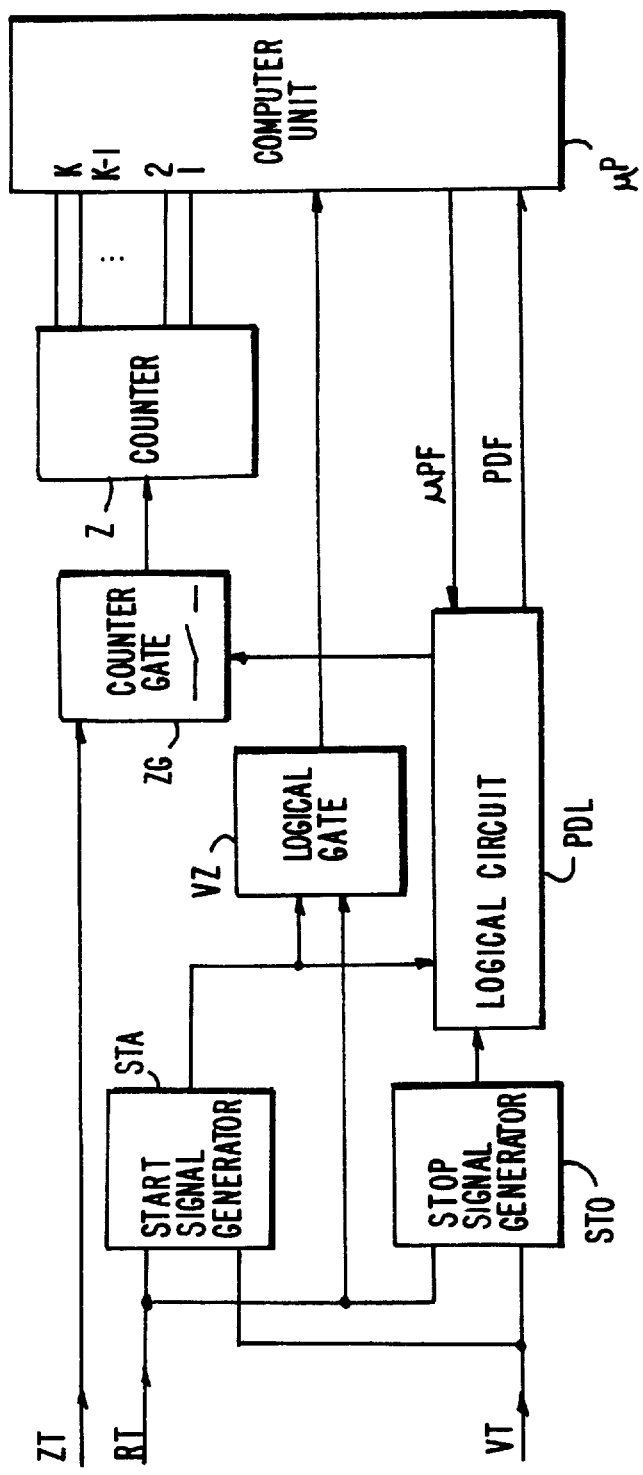
FIG. 1 is a block diagram of a digital phase detector.

A digital phase detector is represented in FIG. 1, which detects the phase difference between a reference clock pulse RT and a comparison clock pulse VT. The reference clock pulse RT and the comparison clock pulse VT are both input to a logical gate STA, which generates start signals, and a logical gate STO, which generates stop signals. Other components can also be used for the first means STA and STO. A first pulse generates a start signal, and a second pulse following the first generates the associated stop signal, independently of which of the two pulses comes from the reference clock pulse RT and the comparison clock pulse VT. Second means, for example a logical gate VZ, detect which of the two clock pulses, the reference clock pulse RT or the comparison clock pulse VT, has triggered the respective start signal. Thus the gate VZ provides the information whether the phase of the comparison clock pulse RT is leading or trailing. This is the equivalent of sign information.

To achieve satisfactory chronological resolution it is advantageous to employ rectangular signals for the reference clock pulse RT and the comparison clock pulse VT and for the logical gates STA and STO, which trigger on the basis of the edges of these rectangular signals.

A logical circuit PDL controls a counter gate ZG with the aid of the start and stop signals. With its aid and with a counter Z, the pulses of a counting clock pulse signal ZT are counted. The result is output at a parallel interface 1, 2, . . ., k of the counter Z. The phase difference between the reference clock pulse RT and the comparison clock pulse VT is therefore digitally available as a counter value and can be processed in an advantageous manner directly, for example by a computing unit $\mu$P. The frequency of the counting clock pulse ZT must be as high as possible in order to receive a small quantization error created by the digital resolution.

Third means, for example a computing unit $\mu$P, which can be a microprocessor, signal processor or ASIC, accomplish control and information processing of the phase detector. When a counter value has been read into the computing unit $\mu$P, it issues a signal MPF to the logic circuit PDL. The latter thereupon resets the counter Z and the gate VG and by means of a start and stop pulse starts a new counting cycle in the counter gate VG and counter Z. When the counting cycle is terminated and the counter value is present at the parallel interface of the counter Z, the logic circuit PDL sends a signal PDF to the computing unit $\mu$P, so that the latter reads in the counter value and the sign information. The phase difference between the reference clock pulses RT and the comparison clock pulses VT is determined in this way, with the period of the reference clock pulse RT, at periodic intervals.

Figure 2:
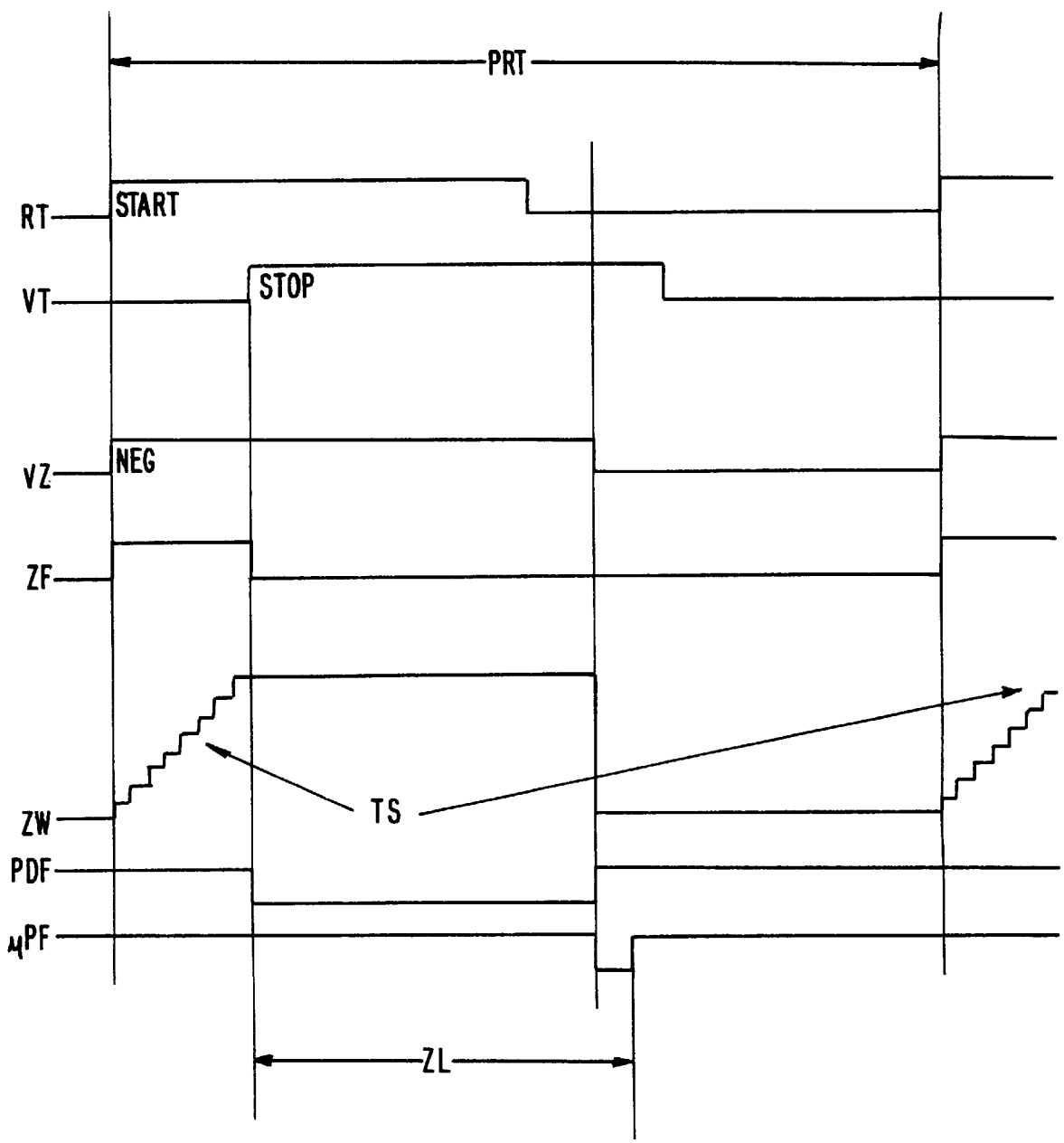
FIG. 2 is a graphical illustration of the chronological signal cycles of the phase detectors in FIG. 1.

The chronological cycle of the signals of the digital phase detector is represented in FIG. 2. RT identifies the reference clock pulse RT of a period length of PRT, and VT the comparison clock pulse VT. The phase of the reference clock pulse RT is leading in respect to the phase of the comparison clock pulse VT and therefore generates a start signal (in the logic gate STA, FIG. 1). The comparison clock pulse VT generates a stop signal. The information that the pulse of the reference clock pulse RT leads the comparison clock pulse VT can be interpreted as sign information VZ and is identified with negative neg in this exemplary embodiment.

The start signal and the stop signal define a time window ZF, in which the counting gate ZG and the counter Z (FIG. 1) count the pulses of the counting clock pulse signal ZT. The result is the counter value ZW. The incrementation phase of the counter value ZW is represented in the form of stair steps TS in FIG. 2

The stop signal, which here comes from the comparison clock pulse VT, generates the signal PDF in the logic circuit PDL (FIG. 1), which causes the computing unit $\mu$P to read in the counter value ZW. When the computing unit $\mu$P is finished with reading :in the counter value ZW and the information processing, it issues the signal MPF to the logic circuit PDL. The signal MPF causes the logic circuit PDL to reset the counter value ZW and the sign information VZ. The computing unit $\mu$P is ready for a new counting cycle after a time period ZL.

The chronological cycle of the signal represented in FIG. 2 is by way of example. The signals PDF and MPF, for example, could also occur at a later time.

Figure 3:
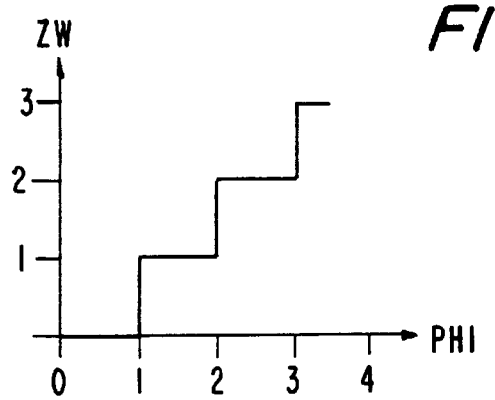
FIG. 3 is a characteristic detector curve of a digital phase detector without sign information.

The counter value ZW is a function of a quantized phase difference PHI, as represented in the diagram in FIG. 3.

Figure 4:
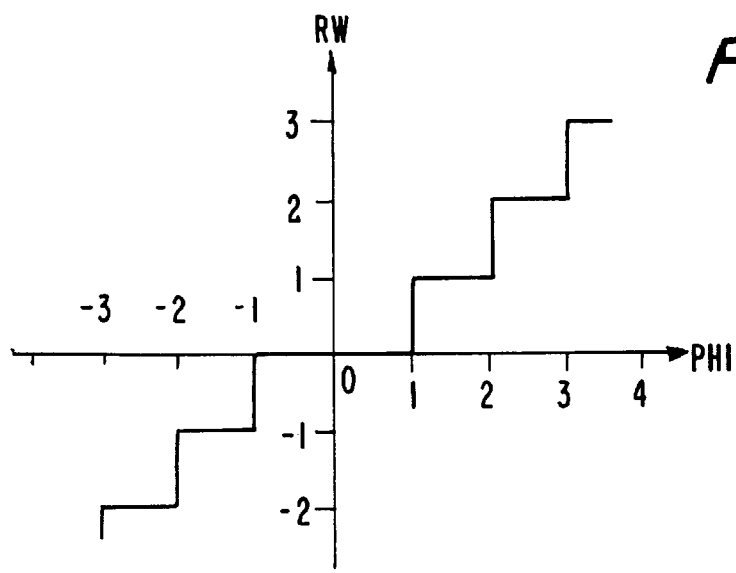
FIG. 4 is a characteristic detector curve of a digital phase detector with sign information.

In the diagram in FIG. 4, the sign information VZ has been included to form a calculated value RW, so that the negative phase differences PHI are also defined. This can be realized in the computing unit $\mu$P (FIG. 1), for example by multiplying the counter value ZW with the sign information VZ.

As a function of the phase difference PHI, the calculated value RW represents a characteristic curve of the phase detector. It can be seen from the function in FIG. 4, that a phase range PHI from −1 to +1 is associated with the calculated value RW=0.

Figure 5:
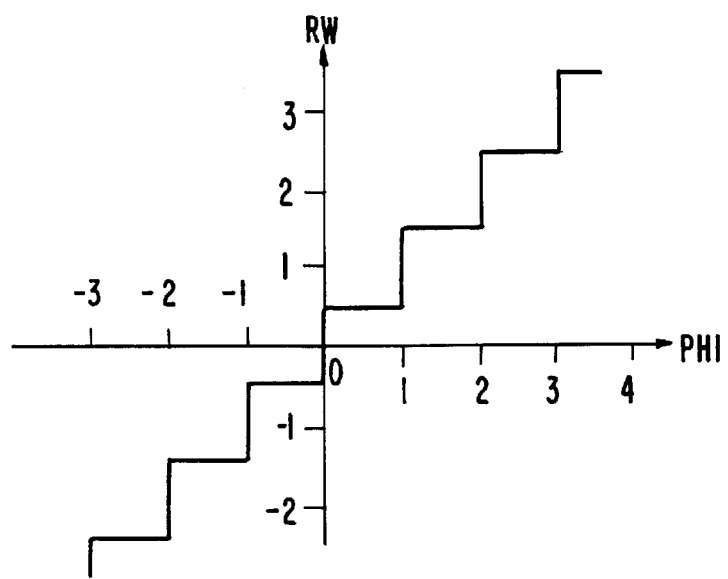
FIG. 5 is a characteristic detector curve of a digital phase detector with a jump at the zero point.

A characteristic curve of a digital phase detector is represented in FIG. 5, which shows a jump at the point PHI=0. A phase detector with this characteristic curve can be advantageously used in a phase control circuit in order to considerably reduce the effects of the quantization stages of the digital phase detector on the comparison clock pulse VT. The phase noise (caused by quantization) of the digital phase detector is considerably reduced by the jump at the point PHI=0, because a calculated value RW greater or smaller than zero can be present, even with the smallest phase differences PHI. The sign information VZ indicates whether the phase of the comparison clock pulse VT leads or trails that of the reference clock pulse RT. This provides information for the phase control circuit, even with small phase difference PHI, whether the frequency of the comparison clock pulse must be increased or reduced. A very good phase synchronization is achieved by this step.

The characteristic curve in FIG. 5 can be derived from the characteristic curve in FIG. 3, in that first a numerical value, for example 0.5, is added to it and the result obtained in this way is subsequently multiplied by the sign. The characteristic curve in FIG. 5, which passes through the zero point, can also be shifted in respect to it. This makes possible a phase control circuit, for example, which regulates a comparison clock pulse, which is not equal to zero, in respect to a reference clock pulse RT. For this purpose, first a constant, which corresponds to this phase shift, is subtracted from the counter value ZW, then 0.5 is added to it and then a multiplication with the sign is performed.

Figure 6:
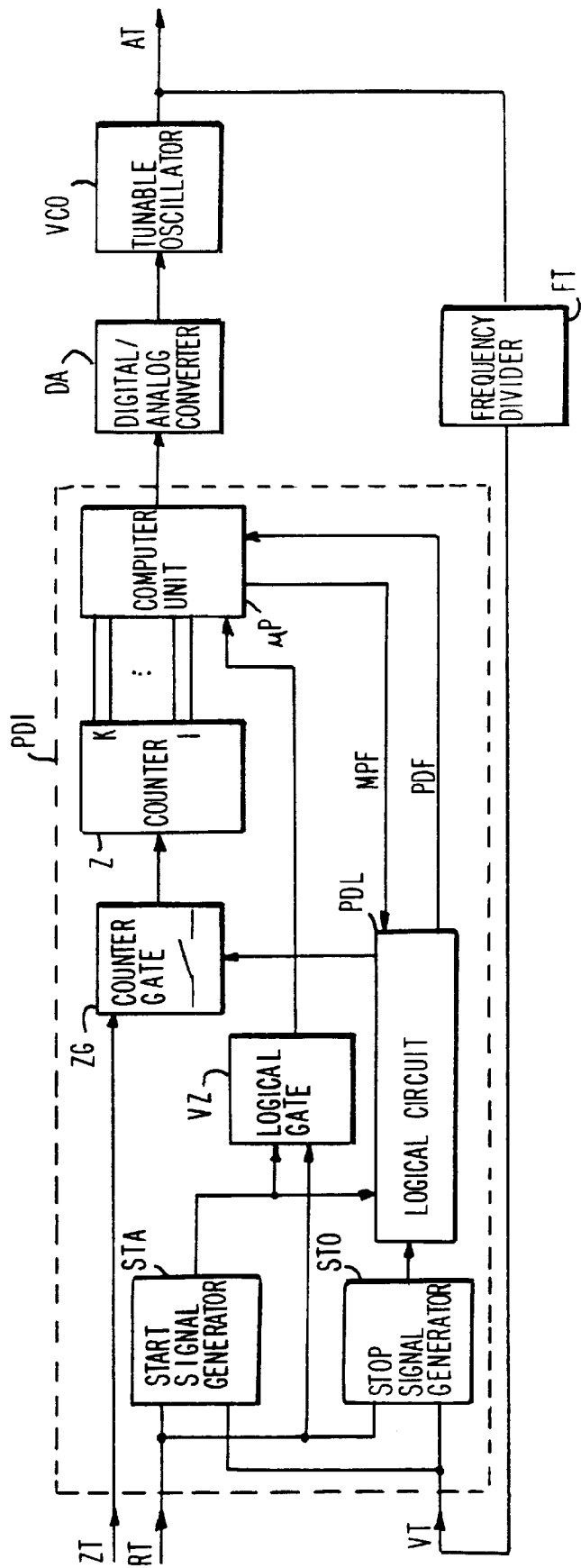
FIG. 6 is a block diagram of a phase control loop with a digital phase detector, wherein processing of the sign and the generation of the jump of the characteristic detector curve is stored in a memory.

A phase control circuit with a digital phase detector PD1, a digital/analog converter DA, a tuneable oscillator VCO and a frequency divider FT is represented in FIG. 6. The frequency divider FT causes an output clock pulse AT which is different from the frequency of the reference clock pulse RT.

The phase detector PD1 corresponds to the phase detector described by means of FIG. 1. A computing unit MP registers a counter value of the counter Z and a sign information of the logic gate VZ at periodic intervals. The computing unit MP processes these data internally by means of a program run in order to generate the characteristic detector curve in accordance with FIG. 5. Based on the characteristic detector curve, the computing unit MP controls the oscillator VCO for adjusting the comparison clock pulse VT.

Figure 7:
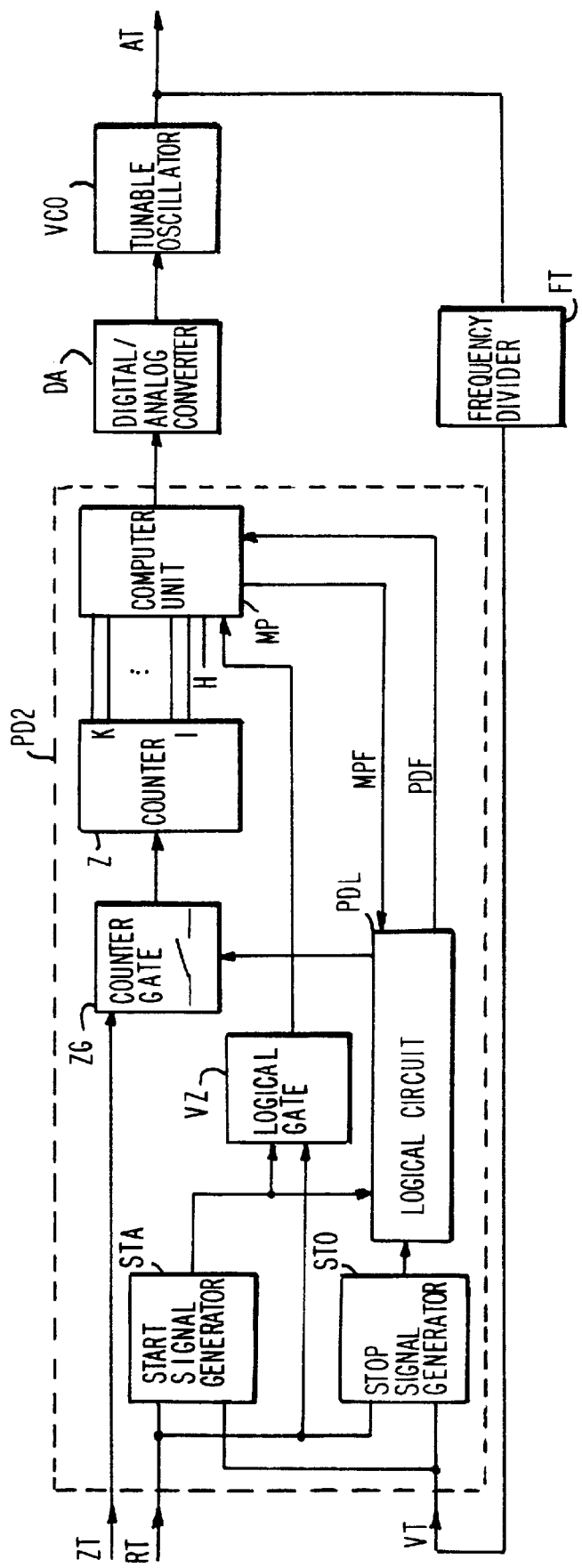
FIG. 7 is a block diagram of a phase control loop with a digital phase detector, wherein processing of the sign and the generation of the jump at the zero point of the characteristic detector curve is realized by means of switching technology.

A phase control circuit with a further digital phase detector PD2 is represented in FIG. 7. The counter value of the counter Z and the sign information of the logic gate VZ are here connected with the computing unit MP by means of switching technology in such a way that the computing effort for generating the characteristic detector curve can be omitted in the computing unit MP. For this purpose, the k bits 1, 2, . . . , k of the counter value are read in at the input of the computing unit MP at the points 2, 3, . . . , k+1, and the input line for the lowest bit 1 is fixedly set to the level H (high). In the dual system this corresponds to an addition of 0.5 to the counter value. The sign information Vz is connected with the input bit of the data input which is relevant for the sign.

I claim:

1. A digital phase detector for determining a phase relationship between a reference clock pulse signal and a comparison clock pulse signal, said digital phase detector comprising:

means (STA) for generating a start signal and means (STO) for generating a stop signal from respective chronologically successive pulses of the reference clock pulse signal (RT) and the comparison clock pulse signal (VT), a counter (Z) for counting counter clock pulses of a counter clock pulse signal (ZT), means (PDL) for turning said counter on in response to said start signal and for turning said counter off in response to said stop signal so that said counter counts said counter clock pulses during a time window between said start signal and said stop signal to obtain a counter count (ZW) which is a measure of a phase shift between the reference clock pulse signal and the comparison clock pulse signal, means (VZ) for obtaining phase shift sign information from said comparison clock pulse signal and said reference clock pulse signal, and means ($\mu$P) for adding a constant to said counter count (ZW) and for subsequently assigning said phase shift sign information thereto to form a resulting phase shift signal.

2. The digital phase detector as defined in claim 1, wherein said means for adding said constant includes a digital input for said counter count and means for performing said adding including fixed wiring at said digital input that adds said constant to said counter value.

3. The digital phase detector as defined in claim 1, wherein said constant is 0.5 and said counter count includes k bits, and wherein said means for adding said constant includes a digital input for said counter count, means for shifting said k bits of said counter count at said digital input by one bit toward higher bit values and resetting a lowest bit of said k bits permanently to level "H" at said digital input.

4. A phase control circuit comprising a digital phase detector for determining a phase relationship between a reference clock pulse signal and a comparison clock pulse signal, said digital phase detector comprising means (STA) for generating a start signal and means (STO) for generating a stop signal from respective chronologically successive pulses of the reference clock pulse signal (RT) and the comparison clock pulse signal (VT), a counter (Z) for counting counter clock pulses of a counter clock pulse signal (ZT), means (PDL) for turning said counter on in response to said start signal and for turning said counter off in response to said stop signal so that said counter counts said counter clock pulses during a time window between said start signal and said stop signal to obtain a counter count (ZW) which is a measure of a phase shift between the reference clock pulse signal and the comparison clock pulse signal, means (VZ) for obtaining phase shift sign information from said comparison clock pulse signal and said reference clock pulse signal, and means ($\mu$P) for adding a constant to said counter count (ZW) and for assigning said phase shift sign information thereto to form a resulting phase shift signal;

a digital/analog converter (DA) connected to said means ($\mu$P) for adding said constant to receive said resulting phase shift signal and to produce an analog output signal;

a tunable oscillator (VCO) connected to said digital/analog converter to receive the analog output signal therefrom and to produce an oscillator output signal; and a frequency divider (FT) connected to the tunable oscillator (VCO) and including means for producing an output clock signal (AT) of a different frequency from that of said oscillator output signal.

5. A method of making a phase control signal with reduced quantization errors, said method comprising the steps of:

a) generating a start signal and a stop signal from respective chronologically successive pulses of a reference clock pulse signal (RT) and a comparison clock pulse signal (VT), b) counting counter clock pulses of a counter clock pulse signal (ZT) of a frequency comparatively higher than that of said reference and comparison clock pulse signals, c) starting said counting in response to said start signal and stopping said counting in response to said stop signal so that said counting takes place during a time window between said start signal and said stop signal to obtain a counter count (ZW) which is a measure of a phase shift between the reference clock pulse signal and the comparison clock pulse signal, d) obtaining phase shift sign information from said comparison clock pulse signal and said reference clock pulse signal, and e) adding a constant to said counter count (ZW) and assigning said phase shift sign information to the counter count to form a resulting phase shift signal.

* * * * *